(12) United States Patent
Hata et al.

(10) Patent No.: US 7,763,967 B2
(45) Date of Patent: Jul. 27, 2010

(54) SEMICONDUCTOR DEVICE WITH SURFACE MOUNTING TERMINALS

(75) Inventors: Toshiyuki Hata, Maebashi (JP); Takeshi Otani, Takasaki (JP); Ichio Shimizu, Tamamura (JP)

(73) Assignee: Renesas Technology Corp., Tokyo (JP)

( * ) Notice: Subject to any disclaimer, the term of this patent is extended or adjusted under 35 U.S.C. 154(b) by 227 days.

(21) Appl. No.: 12/155,375

(22) Filed: Jun. 3, 2008

(65) Prior Publication Data

US 2008/0315378 A1 Dec. 25, 2008

Related U.S. Application Data

(63) Continuation of application No. 11/041,437, filed on Jan. 25, 2005, now abandoned.

(30) Foreign Application Priority Data

Mar. 9, 2004 (JP) ............... 2004-065413

(51) Int. Cl.
*H01L 21/461* (2006.01)
(52) U.S. Cl. .............. 257/692; 257/672; 257/678; 257/686; 257/E23.031
(58) Field of Classification Search ......... 257/666–686, 257/690–692, 721–737
See application file for complete search history.

(56) References Cited

U.S. PATENT DOCUMENTS

| | | | |
|---|---|---|---|
| 4,935,803 A | 6/1990 | Kalfus et al. | |
| 6,396,127 B1 | 5/2002 | Munoz et al. | |
| 6,479,888 B1 * | 11/2002 | Hirashima et al. | 257/673 |
| 6,608,368 B2 * | 8/2003 | Ohashi | 257/668 |
| 6,777,800 B2 | 8/2004 | Madrid et al. | |
| 6,897,567 B2 | 5/2005 | Horie | |
| 2003/0111739 A1 | 6/2003 | Kouzuki et al. | |

FOREIGN PATENT DOCUMENTS

| | | |
|---|---|---|
| JP | 2000-223634 | 8/2000 |
| JP | 2003-086787 | 3/2003 |

* cited by examiner

*Primary Examiner*—Dung A. Le
(74) *Attorney, Agent, or Firm*—Mattingly & Malur, P.C.

(57) ABSTRACT

A semiconductor device has a sealing body formed of an insulating resin and a semiconductor chip positioned within the sealing body. A gate electrode and a source electrode are on a first main surface of the semiconductor chip and a back electrode (drain electrode) is on a second main surface thereof. An upper surface of a portion of a drain electrode plate that projects in a gull wing shape is exposed from the sealing body and a lower surface thereof is connected to the back electrode through an adhesive. A gate electrode plate projects in a gull wing shape on an opposite end side of the sealing body and is connected to the gate electrode within the sealing body. A source electrode plate projects in a gull wing shape on the opposite end side of the sealing body and is connected to the source electrode within the sealing body.

8 Claims, 13 Drawing Sheets

SEMICONDUCTOR DEVICE WITH SURFACE MOUNTING TERMINALS

This application is a continuation application of U.S. Ser. No. 11/041,437, filed Jan. 25, 2005 now abandoned.

CROSS-REFERENCE TO RELATED APPLICATION

The present application claims priority from Japanese patent application No. 2004-065413 filed on Mar. 9, 2004, the content of which is hereby incorporated by reference into this application.

BACKGROUND OF THE INVENTION

The present invention relates to a semiconductor device and a method of manufacturing the same. Particularly, the present invention is concerned with a technique applicable effectively to the manufacture of a semiconductor device wherein a semiconductor chip which generates a large amount of heat is sealed.

As a high output semiconductor device there is known a semiconductor device wherein a semiconductor chip formed with a power transistor is incorporated within a sealing body. As examples of power transistors are mentioned power MOSFET (Metal Oxide Semiconductor Field-Effect-Transistor), IGBT (Insulated Gate Bipolar Transistor), and bipolar power transistor.

A power MOSFET device is of a structure wherein a power MOSFET chip is incorporated within a sealing body. As a power MOSFET device there is known one having a structure wherein a metallic member serving as a drain terminal is exposed to the bottom of a sealing body formed of an insulating resin, and lead terminals for source and gate respectively are disposed on one side of the sealing body. The lead terminals for source and gate are partially bent and exposed to an upper surface of the sealing body. The lead terminals for source and gate extending into the sealing body are electrically connected respectively to source and gate electrodes on an upper surface of a semiconductor chip fixed onto the metallic member. These leads are ultrasonic-bonded to Au bumps which are arranged on source and gate electrodes uniformly by a wire ball bonding method. (See, for example, Patent Literature 1.) On the other hand, in connection with manufacture of a semiconductor device (LFPAK: Loss Free Package), there is known a technique wherein gold bumps are formed on a main surface of a semiconductor wafer and thereafter the semiconductor wafer is diced into individual semiconductor chips having gold bumps (bump electrodes) (see, for example, Patent Literature 2).

[Patent Literature 1]
Japanese Unexamined Patent Publication No. 2000-223634

[Patent Literature 2]
Japanese Unexamined Patent Publication No. 2003-86787

SUMMARY OF THE INVENTION

The present inventors have made studies about improving the heat dissipating performance of a high output semiconductor device having a sealing body formed of an insulating resin and also about reducing the packaging cost.

As a high output semiconductor device there is known one having a structure wherein metallic lead terminals and die terminals (electrode plates) are exposed to an upper surface and a back surface of a sealing package (sealing body) for improving the heat dissipating performance, as is disclosed in Patent Literature 1.

In this structure, the electrode plates (die terminals) to which a back electrode of a semiconductor chip, (electrode formed substantially throughout the whole area of the chip), is connected are exposed to a lower surface of the sealing body, while electrode plates (lead terminals) connected to electrodes (bump electrodes) formed on an upper surface (main surface) of the semiconductor chip are exposed to the lower surface of the sealing body. When the semiconductor device is mounted on a mounting substrate, the electrode plates (die terminals) confront the mounting substrate.

For the dissipation of heat from the electrode plates exposed to the lower surface of the sealing body to the mounting substrate, it is necessary that, for example, a copper layer superior in thermal conductivity be built into the mounting substrate. As a result, the cost of the mounting substrate becomes high, obstructing the reduction of the packaging cost.

It is an object of the present invention to provide a semiconductor device superior in heat dissipating performance and a method of manufacturing the same.

It is another object of the present invention to provide a semiconductor device which permits reduction of the packaging cost and a method of manufacturing the same.

It is a further object of the present invention to provide an electronic device superior in heat dissipating performance and permitting reduction of the packaging cost.

The above and other objects and novel features of the present invention will become apparent from the following description and the accompanying drawings.

Typical modes of the present invention as disclosed herein will be outlined below.

(1) A semiconductor device comprising:
a sealing body formed of an insulating resin, the sealing body having an upper surface, a lower surface opposite to the upper surface, and side faces connecting the upper surface and the lower surface with each other;
a semiconductor chip positioned within the sealing body, the semiconductor chip having a plurality of electrodes over a first main surface thereof and a back electrode over a second main surface thereof opposite to the first main surface;
a plurality of first electrode plates, one end sides of the first electrode plates being positioned within the sealing body, the electrodes of the semiconductor chip being connected to upper surfaces of the one end sides of the first electrode plates, opposite end sides of the first electrode plates projecting sideways of the sealing body and being bent to form gull wing-shaped surface mounting terminals; and
a second electrode plate, an upper surface of one end side of the second electrode plate being exposed to the upper surface of the sealing body, the back electrode over the semiconductor chip being connected through an adhesive to a lower surface of the second electrode plate opposite to the upper surface of the one end side, an opposite end side of the second electrode plate projecting sideways of the sealing body and being bent to form gull wing-shaped surface mounting terminals.

The portion of the second electrode plate projecting sideways from the sealing body branches into plural portions and the plural branched portions constitute the surface mounting terminals.

Depressions to which side edges of the electrode plate are opened are formed in side edges of a part of the upper surface of the second electrode plate and the resin which forms the sealing body is buried into the depressions. Likewise, depressions are formed in upper surfaces of at least a part of branch starting portions of the branch ends and also in upper surfaces of electrode plate edges each extending between adjacent branch ends. The opposite surface portions of the electrode plate corresponding to the depressions are projected. The resin which forms the sealing body is buried into the depressions and the projecting portions bite into the said resin.

A transistor (field effect transistor) is formed on the semiconductor chip. A first electrode (source electrode) and a control electrode (gate electrode) as salient electrodes are formed over the first main surface of the semiconductor chip. A second electrode (drain electrode) is formed as a back electrode over the second main surface of the semiconductor chip. The source electrode is connected to one first electrode plate and the gate electrode is connected to another first electrode plate.

The semiconductor device constructed as above is manufactured by a method comprising the steps of:

providing first and second lead frames having been subjected to patterning;

providing a semiconductor chip, the semiconductor chip having a plurality of electrodes (source and gate electrodes) over a first main surface thereof and a back electrode (drain electrode) over a second main surface thereof opposite to the first main surface;

electrically connecting the plural electrodes (source and gate electrodes) over the first main surface of the semiconductor chip respectively to a plurality of first electrode plates (source and gate electrode plates) of the first lead frame;

electrically connecting the back electrode (drain electrode) of the semiconductor chip to a second electrode plate (drain electrode plate) of the second lead frame through an electrically conductive adhesive;

forming a sealing body with use of an insulating resin so as to cover one end side of the semiconductor chip and that of the first lead frame and so as to expose a surface side of the second electrode plate (drain electrode plate) of the second lead frame to which surface side the semiconductor chip is not fixed; and cutting off an unnecessary portion of the lead frame and forming the electrode plate portion projecting from the sealing body into surface mounting terminals.

In each of the first and second lead frames, the electrode plate portion extending inside and outside the sealing body is slit in predetermined positions at predetermined intervals to form branch pieces of a predetermined width. That is, in the portion of the source and drain electrode plates projecting from the sealing body, slits are formed at predetermined intervals to form branch pieces of a predetermined width. Ends (branch ends) of the branch pieces form surface mounting terminals.

In the second electrode plate portion (drain electrode plate portion) of the second lead frame covered with the sealing body, side edges of the upper surface of the second electrode plate in contact with the sealing body are formed lower than the other portion of the upper surface for example by etching or using a press machine to form depressions to which side edges of the electrode plate are opened. For example, by extrusion using a press machine, depressions are formed in at least a part of the branch starting portions of the branch pieces and also in electrode plate edge portions each extending between adjacent branch pieces. In this case, the opposite surface portions of the electrode plate corresponding to the depressions are projected. Further, by etching to a predetermined depth on the upper surface side, depressions are formed in side edges of the drain electrode plate.

The following is a brief description of effects obtained by the typical modes of the present invention as disclosed herein.

According to the above means (1), (a) the semiconductor device has a drain electrode plate whose upper surface is exposed to the upper surface of the sealing body. The semiconductor chip is connected to the drain electrode plate through the back electrode of the chip. The back electrode is of about the same size as the semiconductor chip. As a result, heat generated in the semiconductor chip can be transferred effectively to the drain electrode plate. Therefore, by attaching a heat dissipating member to the drain electrode plate, the heat can be dissipated effectively to the exterior and hence it is possible to provide a semiconductor device and a semiconductor package (i.e., an electronic device) both superior in heat dissipating performance. Even without a heat dissipating plate, the heat can be dissipated into the atmosphere from the wide surface of the drain electrode plate.

According to the structure of the semiconductor device, heat is dissipated from the upper surface side of the sealing body, so that no consideration is needed to the dissipation of heat to the mounting substrate as in the prior art and a mounting substrate of a special specification for improving the thermal conductivity, which is high in cost, not needed. As a result, it is possible to reduce the packaging cost.

(b) In manufacturing the semiconductor device with use of lead frames, the drain electrode plate portion projecting to the exterior from the sealing body is formed in a gull wing shape suitable for surface mounting. This gull wing-shaped portion is slit into plural branch pieces (lead portions). Thus, the fabrication is easier than subjecting a single plate to the forming work. As a result, there is obtained an effect that the forming work can be done with a high accuracy without causing damage to the connections (adhesive and salient gate and source electrode portions) between the semiconductor chip and leads. More particularly, as the drain electrode plate there is used a thicker plate than the source and gate electrode plates in order to decrease the electric resistance, so when the drain electrode plate is formed into a gull wing shape, the bending work is done at a larger load. As a result, a large stress is imposed on the drain electrode plate connected to the sealing body, the large stress acting in a direction in which the drain electrode plate is pulled out from the sealing body, with consequent damage to the connections with the semiconductor chip. Damage of the connections is not desirable because it would cause an increase of source-drain resistance Rds (ON). In the present invention, since plural slits are formed in the drain electrode plate formed in gull wing shape to form plural branch pieces (leads), the application of a large load is not required in the forming work. Consequently, a large stress is not imposed on the drain electrode plate in the forming work and hence it is possible to prevent damage of the connections on the surface and back surface of the semiconductor chip. This is also true of the source electrode plate. Plural slits are formed in the source electrode plate to form plural branch pieces (leads), whereby the forming work can be done without damage to the connections with the semiconductor chip.

(c) Depressions are formed partially in the upper surface of the drain electrode plate positioned within the sealing body and the resin which forms the sealing body is buried into the depressions, whereby, in the state of product, the drain electrode plate becomes difficult to fall off from the sealing body. In the semiconductor device manufacturing stage, the upper surface of the drain electrode plate positioned within the sealing body is partially made lower to form depressions and the back surface portions corresponding to the depressions are projected to form projecting portions. As a result, in the stage where the sealing body was formed, the resin which forms the sealing body gets into the depressions and the projecting portions bite into the resin. Consequently, the drain electrode plate is fixed (locked) to the sealing body (resin). Therefore, the forming work for the drain electrode plate can be done without movement of the drain electrode plate relative to the sealing body and without damage to the connections with the semiconductor chip.

DETAILED DESCRIPTION OF A PREFERRED EMBODIMENT

Figure 1:
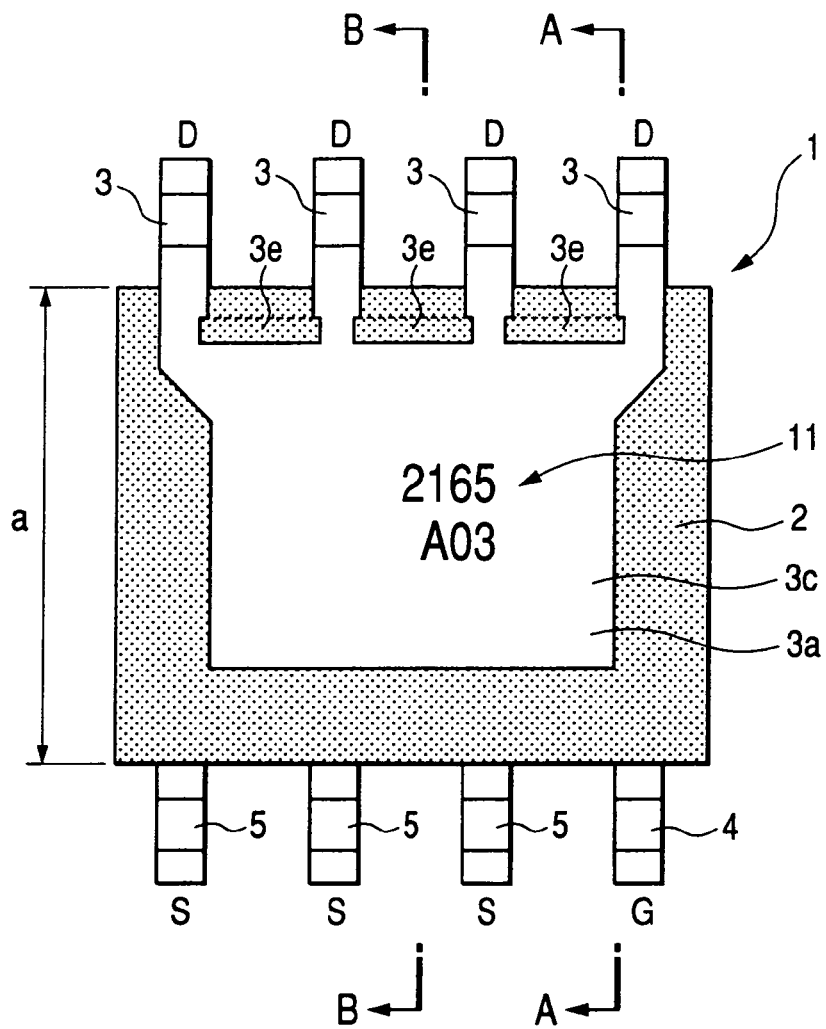
FIG. 1 is a plan view of a semiconductor device according to a first embodiment of the present invention.

An embodiment of the present invention will be described in detail hereinunder with reference to the drawings. In all of the drawings for explaining the embodiment, portions having the same functions are identified by the same reference numerals, and repeated explanations thereof will be omitted.

First Embodiment

FIGS. 1 to 12 are related to the structure of a semiconductor device according to a first embodiment of the present invention. FIGS. 13 to 23 are related to a method of manufacturing the semiconductor device of the first embodiment. FIGS. 24 to 30 are related to a semiconductor device package structure as part of an electronic device in which the semiconductor device of the first embodiment is incorporated.

In this first embodiment, reference will be made to an example in which the present invention is applied to a power MOSFET device (semiconductor device). In the power MOSFET device is incorporated a semiconductor chip formed with a vertical power MOSFET. A source (S) electrode as a first electrode and a gate (G) electrode as a control electrode are provided on a first main surface of the semiconductor chip, while a drain (D) electrode as a second electrode is provided on a second main surface opposite to the first main surface. The second electrode serves as a back electrode formed substantially throughout the whole surface of the semiconductor chip.

In appearance, as shown in FIGS. 1 to 6, the semiconductor device (power MOSFET device), indicated at 1, comprises a sealing body (package) 2 of a flat quadrangular shape formed of an insulating resin and plural leads projecting side by side from both sides (side faces) of the sealing body 2. These leads projecting from both side faces are bent in one step to form gull wing-shaped surface mounting terminals.

Figure 2:
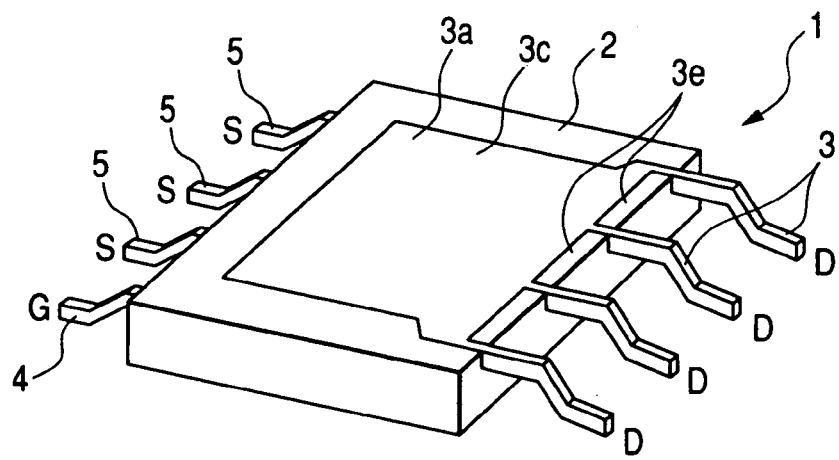
FIG. 2 is a perspective view showing an appearance of the semiconductor device of the first embodiment.
Figure 5:
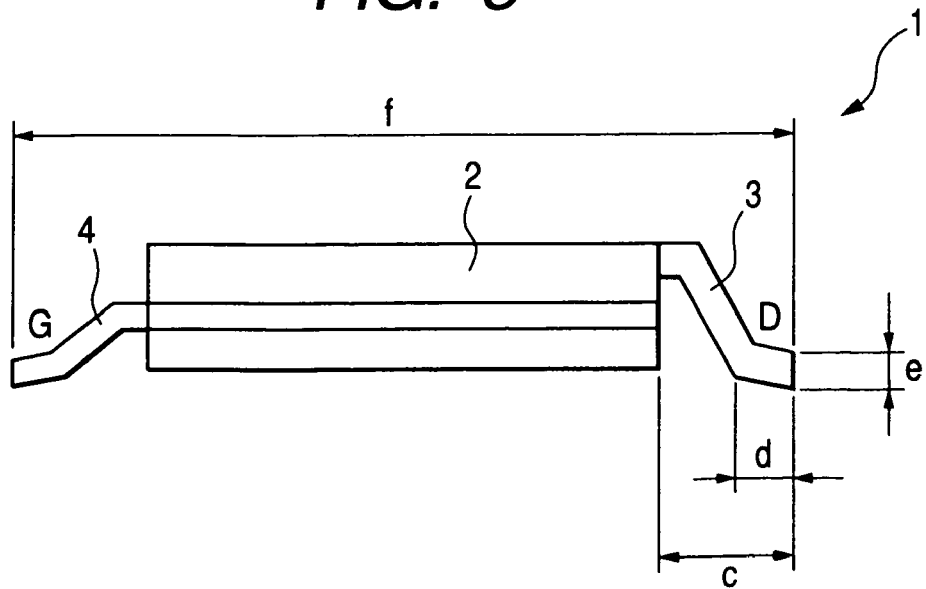
FIG. 5 is a right side view thereof.
Figure 6:
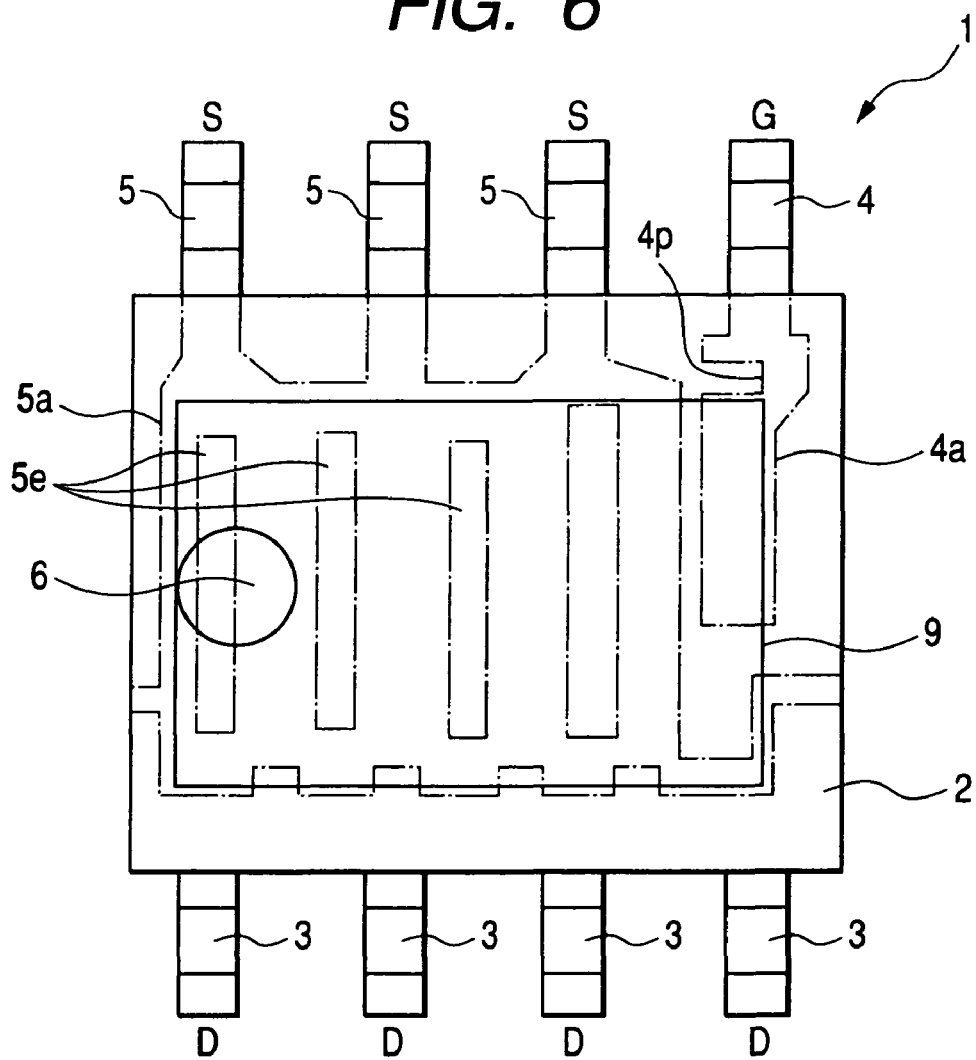
FIG. 6 is a bottom view thereof.

As shown in FIGS. 2 and 5, four leads are projected from the right side face of the sealing body 2 and are arranged at predetermined pitches, although no limitation is made to this arrangement. These four leads serve as drain leads 3. Likewise, four leads are projected from the left side face of the sealing body 2 and are arranged at predetermined pitches. Of these four leads, one lead located on this side is a gate lead 4 and the remaining three are source leads. The leads on both side faces of the sealing body 2 are arranged in corresponding relation to each other in a planar condition (see FIGS. 1 and 6). Further, as shown in FIG. 6, an index 6 for direction identification is provided on a lower surface of the sealing body 2. The index 6 is formed during formation of the sealing body 2 and is constituted by a circular depression formed in the sealing body 2.

Figure 7:
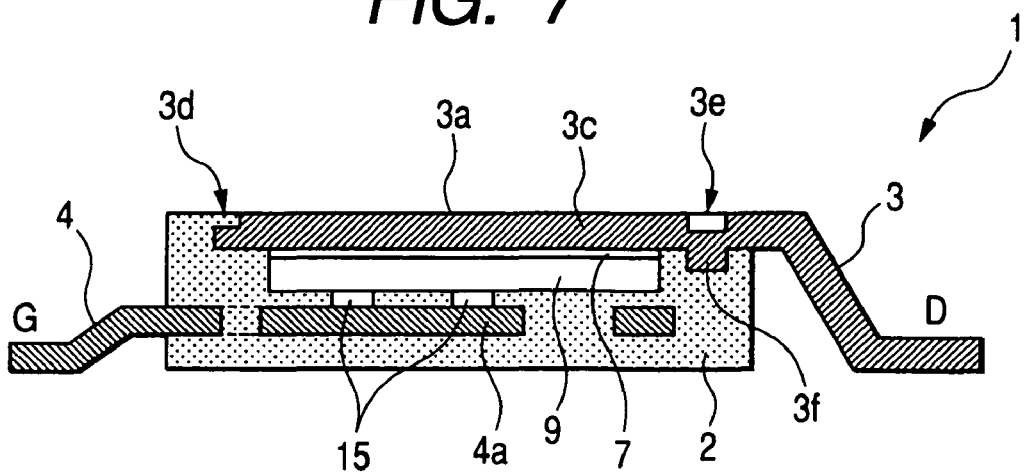
FIG. 7 is a sectional view taken along line A-A in FIG. 1.
Figure 8:
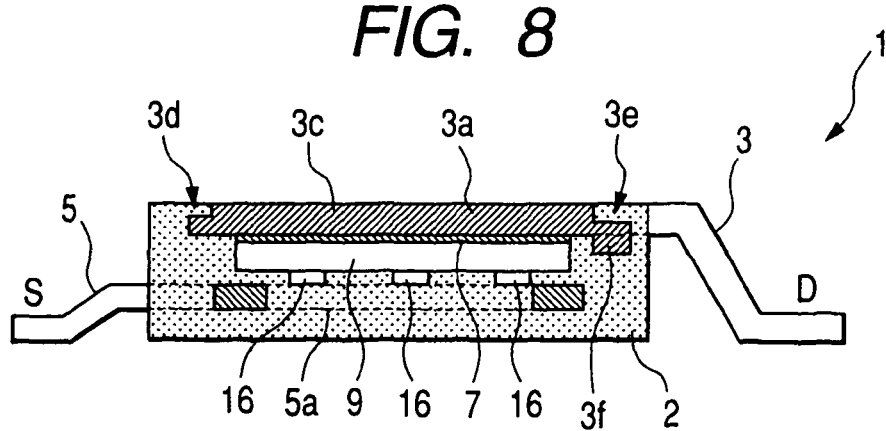
FIG. 8 is a sectional view taken along line B-B in FIG. 1.

As shown in FIGS. 1, 7 and 8, the four drain leads 3 extend from a wide chip fixing portion 3c whose upper surface is exposed to an upper surface of the sealing body 2. The chip fixing portion 3c and the drain leads 3 are here designated a drain electrode plate 3a. For the convenience of explanation, the chip fixing portion 3c alone may be designated the drain electrode plate 3a. The drain electrode plate 3a also serves as a heat sink for the dissipation of heat. As shown in FIG. 8, a second main surface of a semiconductor chip 9 is connected to a lower surface of the drain electrode plate 3a through an adhesive 7. A back electrode (drain electrode) 10 of about the same size as a second main surface of a semiconductor chip, though not shown in FIG. 8, etc., is connected to the second main surface of the semiconductor chip 9 (see FIG. 12). For electric connection between the back electrode (drain electrode) 10 and the drain electrode plate 3a, an electrically conductive adhesive, e.g., Ag paste, is used as the adhesive 7.

Figure 29:
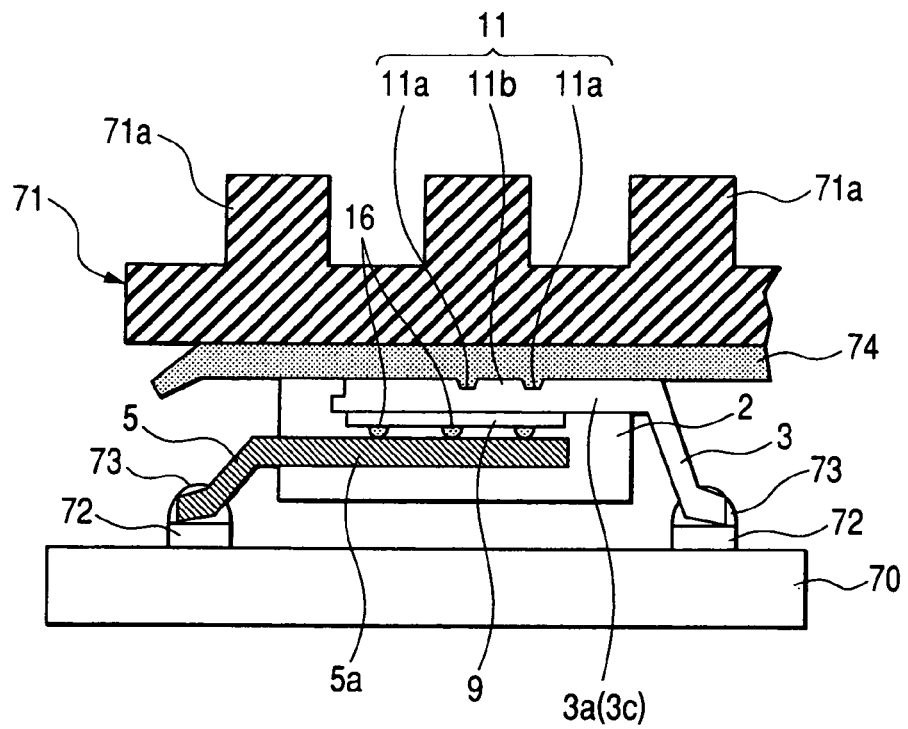
FIG. 29 is a schematic enlarged sectional view showing a state in which the semiconductor device of the first embodiment is mounted on the mounting substrate and the heat dissipating member is attached thereto.

As shown in FIG. 1, a mark 11 is formed by concave and convex on an upper surface (exposed surface) of the drain electrode 3a (see FIG. 29). The mark 11 is formed by engraving the upper surface of the drain electrode plate 3a by the radiation of a laser beam.

As shown in FIGS. 6 to 8, the gate lead 4 is contiguous to a gate electrode lead 4a disposed within the sealing body 2, while the source leads 5 are contiguous to a wide source electrode plate 5a also disposed within the sealing body 2. Patterns of the gate electrode plate 4a and the source electrode plate 5a are indicated with dot-dash lines in FIG. 6 (see FIG. 14). As shown in FIGS. 7 and 8, salient gate electrodes 15 and salient source electrodes 16 are provided on a first main surface of the semiconductor chip 9. The salient gate electrodes 15 on the semiconductor chip 9 are electrically connected to an upper surface of the gate electrode plate 4a, while the salient source electrodes 16 on the semiconductor chip 9 are electrically connected to an upper surface of the source electrode plate 5a. As shown in FIG. 6, slits 5e are formed at predetermined intervals on the source electrode plate 5a and are connected to the salient source electrodes 16 in wide areas each formed between adjacent slits 5e. The gate electrode plate 4a is formed as a thin pattern.

Figure 12:
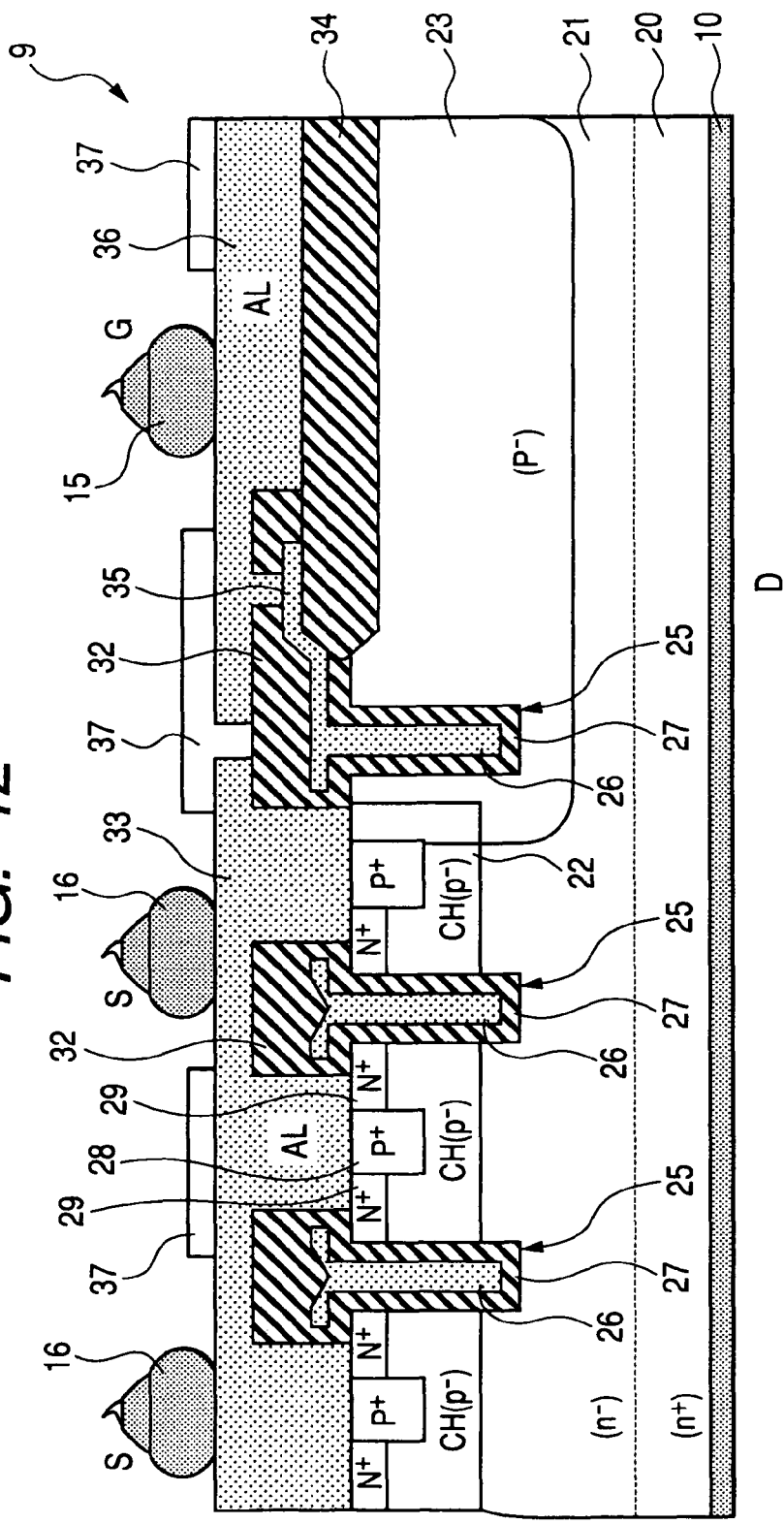
FIG. 12 is an enlarged sectional view showing a part of a semiconductor chip incorporated into the semiconductor device of the first embodiment.
Figure 13:
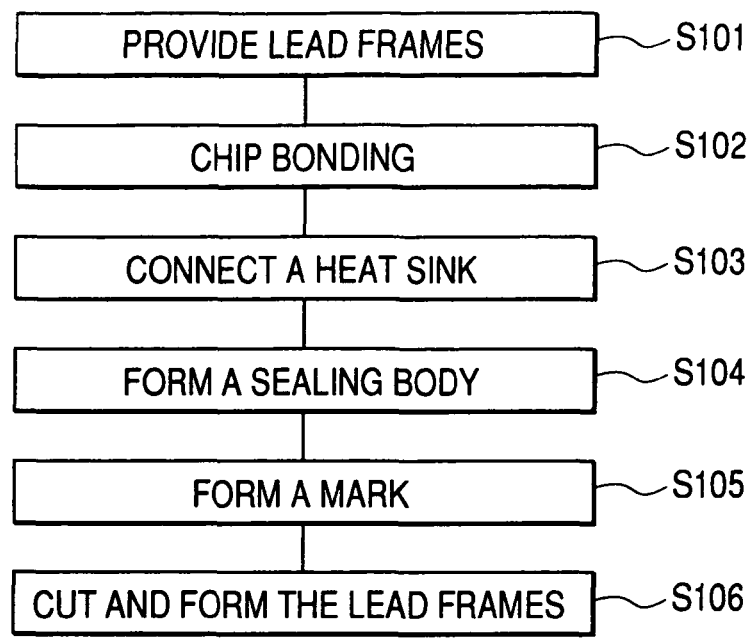
FIG. 13 is a flow chart showing a method of manufacturing the semiconductor device of the first embodiment.

The structure of the semiconductor device 9 will be described below briefly with reference to FIG. 12. FIG. 12 is an enlarged sectional view of a part of the semiconductor chip 9, showing a part of a vertical power MOSFET.

The semiconductor chip 9 includes as a base component an n$^+$ type silicon semiconductor substrate 20 which has an n$^-$ type epitaxial layer 21 on a main surface thereof. In the vertical MOSFET, when seen in plan view, a large number of cells (transistors) are arranged orderly. In the illustrated example, each transistor has a trench configuration. A P$^-$ type channel (CH) layer 22 is formed in a predetermined region of the epitaxial layer 21 and a P$^-$ type well layer 23 serving as a guard ring is formed along the outer periphery of the channel layer 22. A large number of trenches 25 are formed in the cell-forming region so as to extend through the channel layer 22. The trenches 25 are formed also in the well layer 23. The region between the trenches formed in the well layer 23 and the cell-constituting trenches formed at the outermost periphery inside the trenches formed in the well layer is an invalid region not used as cells.

A polysilicon gate layer 26 serving as a gate electrode is formed within each trench. A gate insulating film 27 is formed under the polysilicon gate layer 26. A P$^+$ region 28 is formed in a central surface portion of the channel layer 22 surrounded with trenches. In the channel layer 22 of the cell region, an N$^+$ type source region 29 is formed in a region from outside the P$^+$ region 28 to trenches. The trenches, i.e., the gate insulating film 27 and the polysilicon gate layer 26, are covered with an insulating film 32 which is provided selectively, and a source electrode 33 are formed on the insulating film 32. In an aperture where the insulating film 32 is not formed, the source electrode 33 is electrically connected to the P$^+$ region 28 and the source region 29.

In the region of trenches 25 positioned outside the invalid region, a thick insulating film (LOCOS) 34 is formed contiguously to the gate insulating film 27. Though not shown, the thick insulating film 34 extends beyond the outer periphery of the well layer 23. The polysilicon gate layer 26 buried into the trenches 25 positioned outside the invalid region extends halfway on the thick insulating film 34 to form a peripheral gate wiring 35. The peripheral gate wiring 35 and the thick insulating film 34 are also covered with the insulating film 32. A gate electrode 36 is formed from the insulating film 32 onto the thick insulating film 34. The gate electrode 36 is electrically connected to the polysilicon gate layer 26 through an aperture formed partially in the insulating film 32. Both source electrode 33 and gate electrode 36 are formed by an aluminum film.

An insulating film 37 is formed selectively on the first main surface of the semiconductor chip 9. The source and gate electrodes 33, 36 are selectively covered with the insulating film 37. In an aperture where the insulating film 37 is not formed, the salient source and gate electrodes 16, 15 are formed on the source and gate electrodes 33, 36, respectively. The back electrode 10 as a drain electrode is formed throughout the whole of the second main surface of the semiconductor chip 9.

In this embodiment, the salient gate and source electrodes 15, 16 are formed by wire bonding of gold wires and subsequent tearing off of the wires. However, there may be used, for example, gold bump electrodes or solder bump electrodes.

Such stud type salient electrodes (stud bumps) as the salient gate and source electrodes 15, 16 are formed by the following method. For example, a wire (gold wire) is held by a tubular capillary and the tip of the wire projecting from a lower end of the capillary is sphered (made into a ball) by a sphering work such as electric discharge. Thereafter, the capillary is brought down toward a salient electrode-forming surface of a semiconductor wafer to connect the wire to an electrode while crushing the ball portion. Next, the capillary is raised and the wire is clamped and pulled upward, whereby the wire is broken and a nail head-like salient electrode (bump electrode) is formed. Thereafter, the semiconductor wafer is divided longitudinally and transversely to form semiconductor chips.

The gate electrode plate 4a and the salient gate electrode 15 are directly connected with each other, but an electrically conductive adhesive may be interposed between the two to ensure the connection where required. Likewise, a like adhesive may be interposed between the source electrode plate 5a and the salient source electrodes 16 to ensure the connection.

Figure 3:
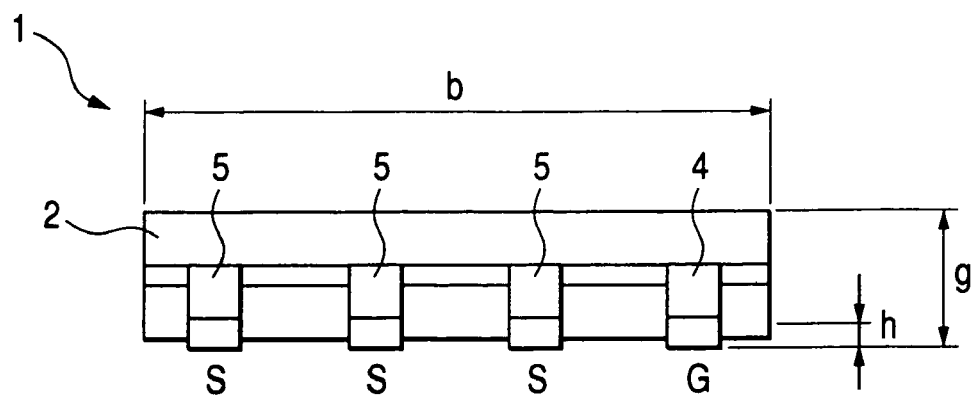
FIG. 3 is a front view of the semiconductor device of the first embodiment.
Figure 4:
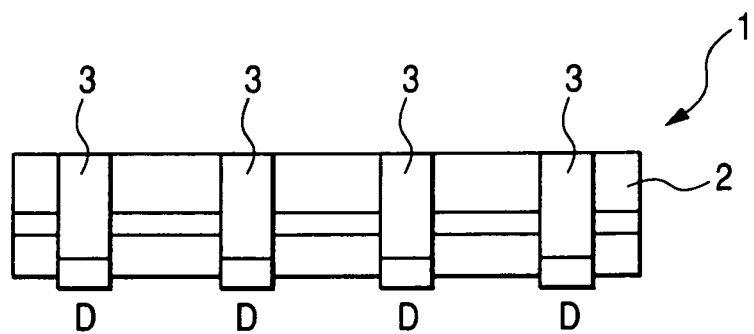
FIG. 4 is rear view thereof.

Reference will here made to an example of size of the semiconductor device 1 according to this first embodiment. As shown in FIGS. 1 and 3, the length a and the width b of the sealing body 2 are 3.95 mm and 4.9 mm, respectively. As shown in FIG. 5, the length c of each drain lead 3 projecting from a side face of the sealing body 2 is 1.2 mm, the length d of each surface mounting terminal is 0.5 mm, and the thickness e of each drain lead 3 is 0.25 mm. Further, an end-to-end length f of lead is 6.1 mm. As shown in FIG. 3, the height g of the semiconductor device is 1.1 mm and the length h up to the lower end of lead projecting downward from the lower surface of the sealing body 2 is 0.07 mm. The thickness of each of gate and source leads is 0.2 mm.

In this first embodiment, the gate, source and drain leads are formed in gull wing shape which permits surface mounting. In the semiconductor device 1, importance is attached to ON resistance and therefore the drain electrode plate is formed thicker than the gate and source electrode plates in order to decrease the electric resistance. Consequently, the forming load in the forming work for the drain electrode plate becomes larger than that in the forming work for the gate and source electrode plates and a stress acting to pull out the drain electrode plate sideways of the sealing body 2 is generated in the forming work after the formation of the sealing body. Consequently, there is a fear of damage to the connection between the semiconductor chip and the drain electrode plate or the connections between the semiconductor chip and the gate, source electrode plates.

To avoid such an inconvenience, according to the semiconductor device 1 of this first embodiment, in the lead frame used, plural slits are formed in the drain electrode plate which is formed in gull wing shape, to form plural branch pieces (drain leads), and then the branch pieces are subjected to a forming work. In this way the forming load is made small to prevent damage (cracking) of the adhesive 7 which connect the drain electrode plate 3a and the semiconductor chip 9.

Since the forming work is performed after formation of the sealing body 2, a certain consideration is given to the drain electrode plate 3a for enhancing the adhesion strength between the drain electrode plate 3a and the resin which forms the sealing body 2. This is for making the drain electrode plate 3a difficult to be pulled out from the resin which forms the sealing body 2 and thereby preventing the exertion of a large force on the connection between the drain electrode plate 3a and the semiconductor chip 3.

Figure 9:
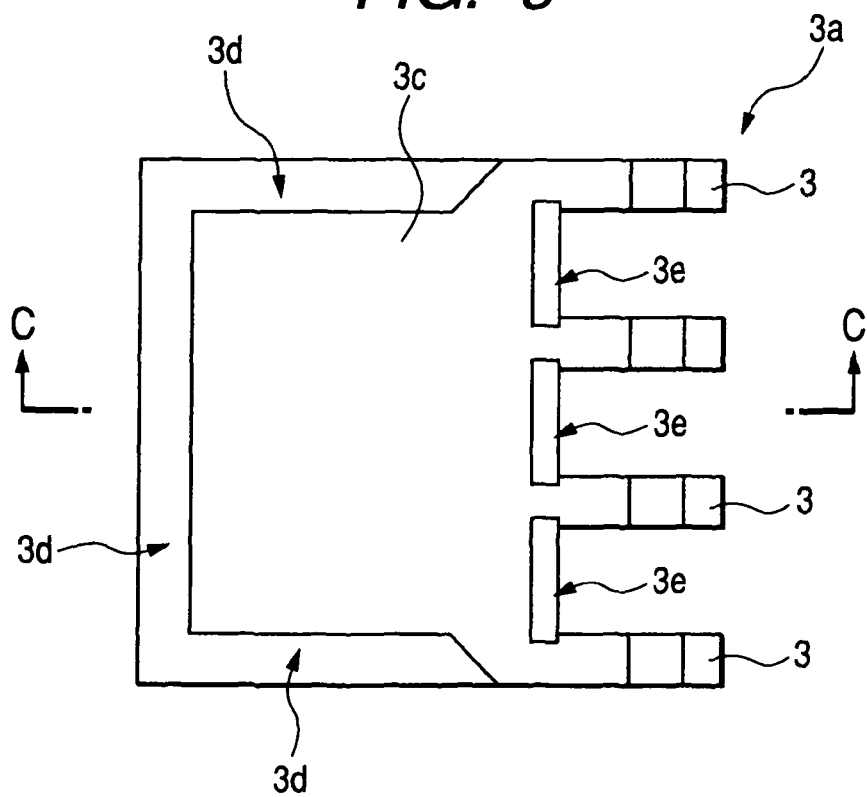
FIG. 9 is a plan view of a drain electrode plate in the semiconductor device of the first embodiment.
Figure 10:
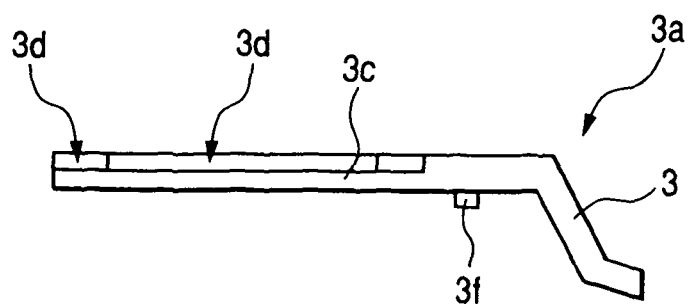
FIG. 10 is a front view of the drain electrode plate.
Figure 11:
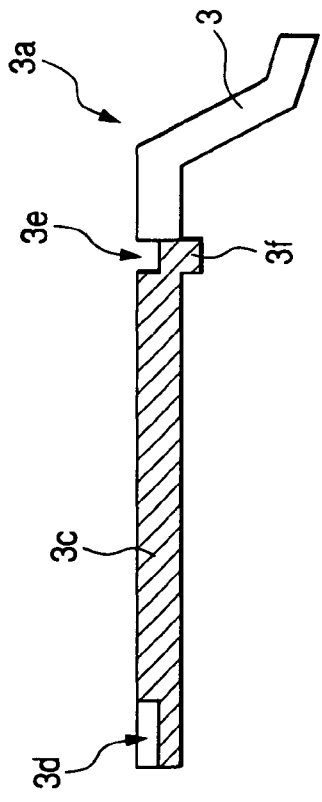
FIG. 11 is a sectional view taken along line C-C in FIG. 9.

FIGS. 9 to 11 illustrate the drain electrode plate 3a including drain leads 3 and removed from the sealing body 2. As shown in FIG. 9, four drain leads 3 are projecting in parallel from one side of the chip fixing portion 3c which is quadrangular in shape. At side edge positions along the three sides of the chip fixing portion 3c where the drain leads 3 of the drain electrode plate 3a are not disposed, depressions 3d are formed by etching, the depressions 3d being open on the peripheral edge sides, or side edges, of the electrode plate, as shown in FIGS. 9 to 11. The depressions 3d are formed, for example, by etching the drain electrode plate 3a to about half of the thickness of the drain electrode plate (see FIG. 11). The depressions 3d are covered with the resin which forms the sealing body 2, as shown in FIGS. 7 and 8. As a result, the adhesion strength (bonding strength) between the drain electrode plate 3a and the sealing body 2 is enhanced.

Further, depressions 3e are formed by extrusion using a press machine so as to be opened on an electrode plate peripheral edge side. The depressions 3e are each formed in at least a part of the branch starting portion of each branch piece (drain lead 3) and also in an electrode plate edge (edge of the chip fixing portion 3c) extending between adjacent branch pieces (drain lead 3). Because of extrusion using a press machine, the opposite surface portions of the drain electrode plate corresponding to the depressions 3e are projected to form projecting portions 3f. As shown in FIGS. 7 and 8, the resin which forms the sealing body 2 is filled into the depressions 3e to enhance the adhesion strength (bonding strength) between the drain electrode plate 3a and the sealing body 2. Moreover, as shown in FIGS. 7 and 8, the projecting portions 3f bite into the resin which forms the sealing body 2, whereby the adhesion strength (bonding strength) between the drain electrode plate 3a and the sealing body 2 is enhanced.

As a result, in the forming work for the drain electrode plate, such a large load as pulls out the drain electrode plate 3a from the sealing body 2 is no longer applied to the drain electrode plate, so that it is possible to prevent damage of the connection between the drain electrode plate 3a and the semiconductor chip 9 and the connections between the semiconductor chip 9 and the gate, source electrode plates 4a, 5a.

Next, a method of manufacturing the semiconductor device according to this first embodiment will be described with reference to FIGS. 13 to 23. As shown in the flow chart of FIG. 13, the semiconductor device 1 is manufactured through the steps of providing lead frames (S101), chip bonding (S102), connecting a heat sink (S103), forming a sealing body(S104), forming a mark (S105) and cutting and forming the lead frames (S106).

Figure 14:
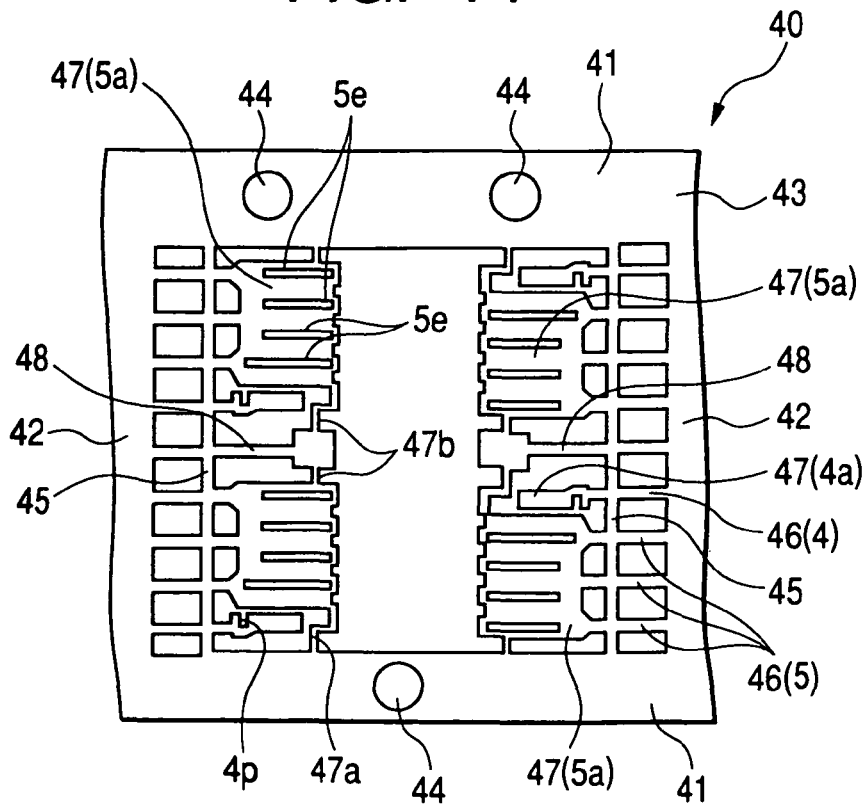
FIG. 14 is a plan view showing a part of a first lead frame used in manufacturing the semiconductor device of the first embodiment.
Figure 15:
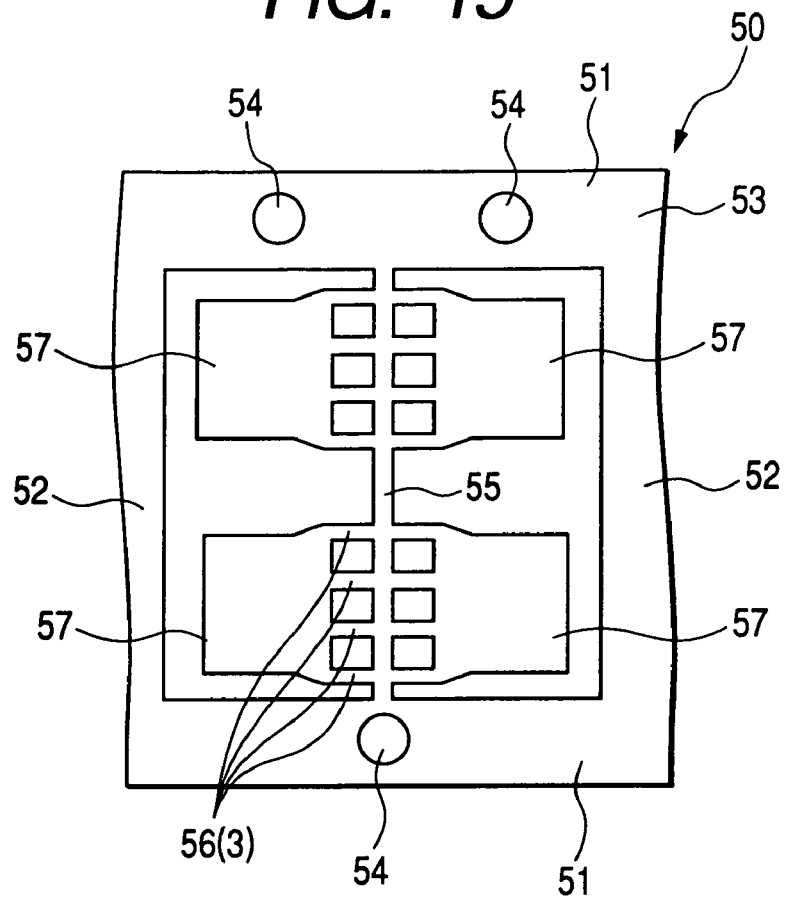
FIG. 15 is a plan view showing a part of a second lead frame used in manufacturing the semiconductor device of the first embodiment.

In manufacturing the semiconductor device 1, a first lead frame 40 as shown in FIG. 14 and a second lead frame 50 as shown in FIG. 15 are provided. FIGS. 14 and 15 are plan views showing a part of the first lead frame 40 and a part of the second lead frame 50, respectively. In FIG. 14 (15), a frame 43 (53) is formed by two outer frames 41 (51) extending in parallel and two inner frames 42 (52) which connect the outer frames 41 (51) with each other. Within the frame 43 (53) there are formed a total of four (two rows×two columns) of lead patterns. Thus, with a single frame 43 (53), four semiconductor devices 1 can be manufactured. Further, guide holes 44 and 54 to be used for conveying and positioning the lead frames are formed in the outer frames 41 and 51, respectively.

In the first lead frame 40, two thin dam pieces 45 are disposed between the pair of outer frames 41. Plural lead portions (branch pieces) 46 extend in parallel from the pair of inner frames 42 so as to cross the dam pieces 45. In the illustrated example, four lead portions 46 are formed by forming three parallel slits in a flat plate. A wide electrode plate 47 is positioned on extensions of the lead portions 46 and the lead portions 46 are contiguous to the electrode plate 47. One lead portion 46 located at an end position is a portion which forms the gate lead 4, and the electrode plate 47 contiguous thereto serves as the gate electrode plate 4a. In the gate electrode plate 4a there is formed a slit 4p extending halfway from one edge to make the gate electrode plate 4a difficult to be pulled out from the sealing body, and a projecting portion is formed adjacent the slit. The salient gate electrodes 15 on the semiconductor chip 9 are connected to the electrode plate 47 which serves as the gate electrode plate 4a.

The three adjacent lead portions are portions serving as source leads and the electrode plate 47 with the three lead portions 46 contiguous thereto is a portion serving as the source electrode plate 5a. The electrode plate 47 serving as the source electrode plate 5a is supported by a thin support piece 47a extending from the associated outer frame 41 and is also supported by a thin support piece 47b extending from a front end portion of a support lead portion 48 which is located outside the four lead portions 46. Four slits 5e referred to previously are formed in the electrode plate 47 serving as the source electrode plate 5a. The portion deviated from the four slits 5e is a portion to which the salient source electrodes 16 on the semiconductor chip 9 are connected. The first lead frame 40 is a flat plate.

The semiconductor device of this first embodiment is of the type wherein a semiconductor chip with transistors incorporated therein is mounted. Gate and source electrodes are positioned on the first main surface of the semiconductor chip, and in the first lead frame 40 it is necessary to dispose an electrode plate which is connected to the gate and source electrodes positioned on the first main surface. To meet this requirement, the first lead frame 40 has a plurality of (two) first electrode plates, one of which is used as the gate electrode plate 4a and the other used as the source electrode plate 5a. In the case where the semiconductor device is an integrated circuit device, a larger number of electrodes are disposed on the first main surface of the semiconductor chip. In this case, there may be used a lead pattern in which the number of first electrode plates is increased in accordance with the number of the electrodes. For the convenience of explanation, each electrode plate and leads extending therefrom may together be designated the electrode plate.

In the second lead frame 50, as shown in FIG. 15, a support piece 55 which provides a connection between the centers of the pair of outer frames 51 is provided. Four lead portions (branch pieces) 56 extend from each of both upper and lower sides in the figure of the support piece 55. That is, four lead portions (branch pieces) 56 are formed by forming three parallel slits in a flat plate. The lead portions 56 are portions which serve as the drain leads 3. The lead portions 56 are connected to the quadrangular electrode plate 57. The electrode plate 57 serves as the chip fixing portion 3c. The second lead frame 50 is a flat plate.

Figure 16:
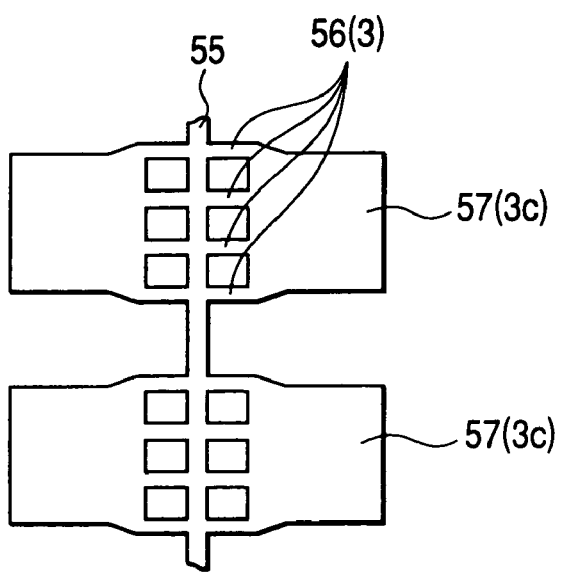
FIG. 16 is a plan view showing a part of the second lead frame.
Figure 17:
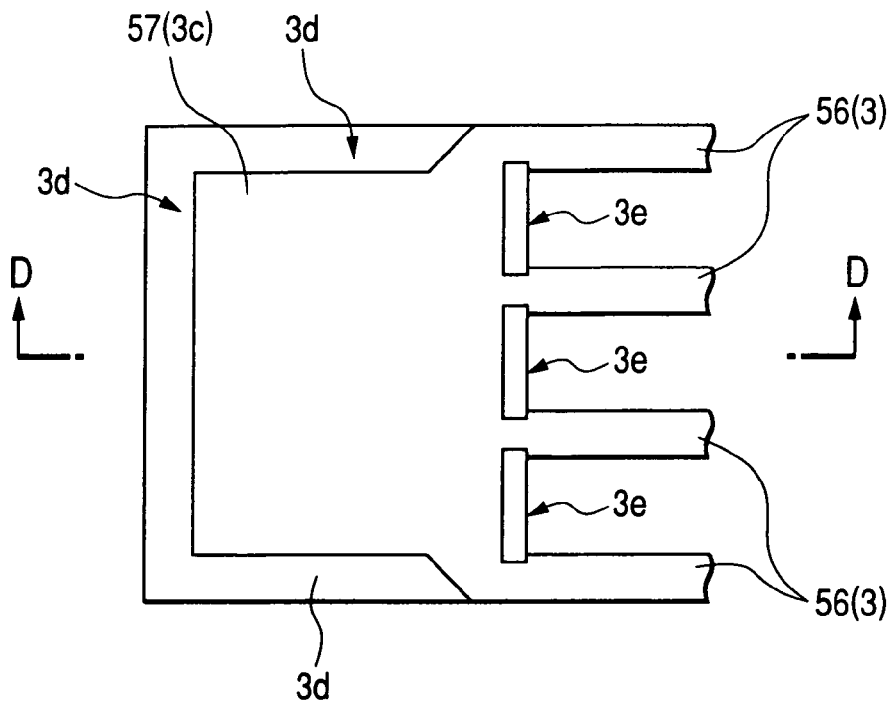
FIG. 17 is a plan view of a drain electrode plate portion of the second lead frame.
Figure 18:
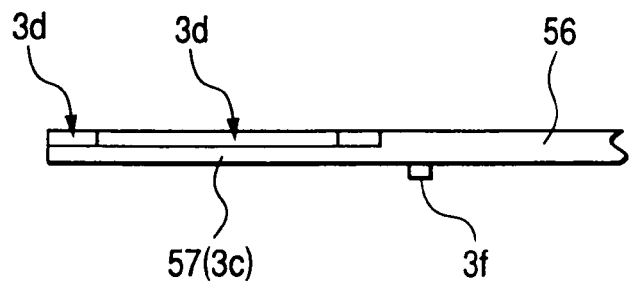
FIG. 18 is a front view of the drain electrode plate portion.
Figure 19:
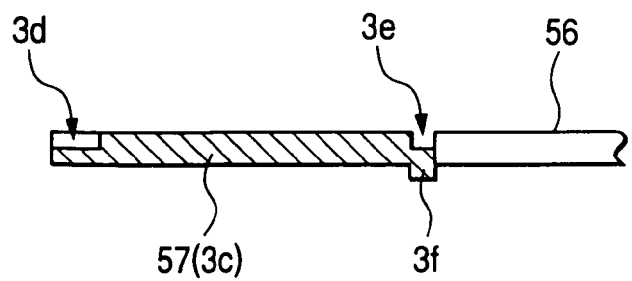
FIG. 19 is a sectional view taken along line D-D in FIG. 17.

FIG. 16 shows the support piece 55, as well as the lead portions 56 (serving as the drain leads 3) and the electrode plate 57 (serving as the chip fixing portion 3c) both contiguous to the support piece 55. In FIGS. 17 to 19 there are shown a single electrode plate 57 and lead portions 56 contiguous to the electrode plate 57. Four drain leads 3 (lead portions 56) are projected in parallel from one side of the quadrangular chip fixing portion 3c (electrode plate 57). In three side edges of the electrode plate 57 where the lead portions 56 are not disposed, as shown in FIGS. 17 to 19, depressions 3d are formed by etching so that their electrode plate peripheral edge sides are open. The depressions 3d are formed for example by etching the electrode plate 57 to about half of the thickness of the electrode plate 57 (see FIG. 19).

Further, depressions 3e are formed by extrusion using a pressing machine so as to be opened on an electrode plate peripheral edge sides. The depressions 3e are each formed in at least a part of the branch starting portion of each lead portion 56 as a branch piece and also in an edge of the electrode plate 57 (chip fixing portion 3c) extending between adjacent branch pieces (lead portions 56). Because of extrusion using a press machine, the opposite surface portions of the drain electrode plate 57 corresponding to the depressions 3e are projected to form projecting portions 3f. For the convenience of explanation, the electrode plate (chip fixing portion) and the leads extending therefrom may together be designated the electrode plate.

The first and second lead frames 40, 50 are obtained by patterning, for example, 2 mm and 2.5 mm thick copper alloy plates by etching or by punching with use of a precision press.

Figure 20:
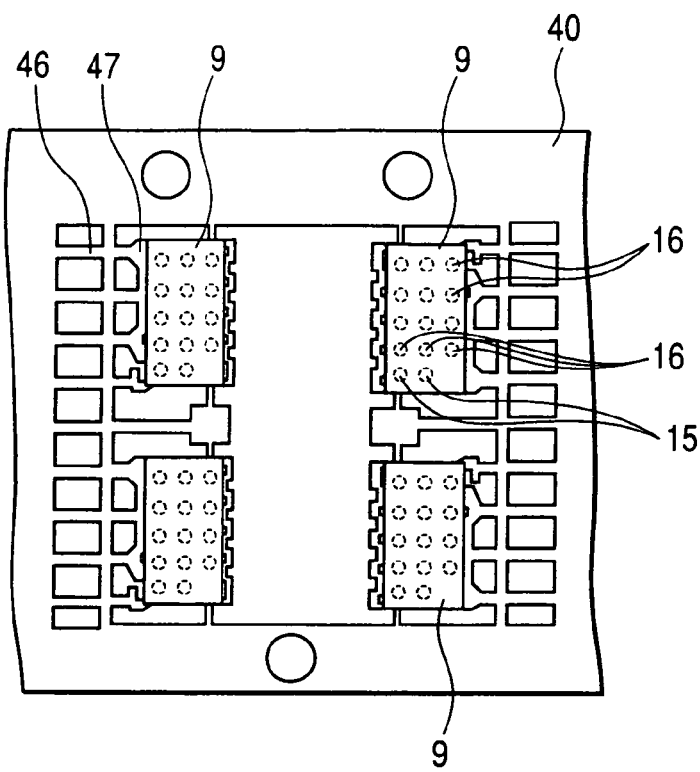
FIG. 20 is a schematic plan view showing a state in which semiconductor chips are mounted on the first lead frame in manufacturing the semiconductor device of the first embodiment.

After the provision of such first and second lead frames 40, 50, as shown in FIG. 20, chip bonding is performed for the lead pattern portions on an upper surface of the first lead frame 40 in such a manner that the first main surface of the semiconductor chip becomes a lower surface (S102). The salient gate electrodes 15 shown in FIG. 12 are connected to the electrode plate (gate electrode plate 4a) shown in FIG. 14 and the salient source electrodes 16 are connected to the electrode plate (source electrode plate 5a) shown in FIG. 14. If necessary, an electrically conductive adhesive is interposed in the connections between the semiconductor chip 9 and the electrode plates 47.

Figure 21:
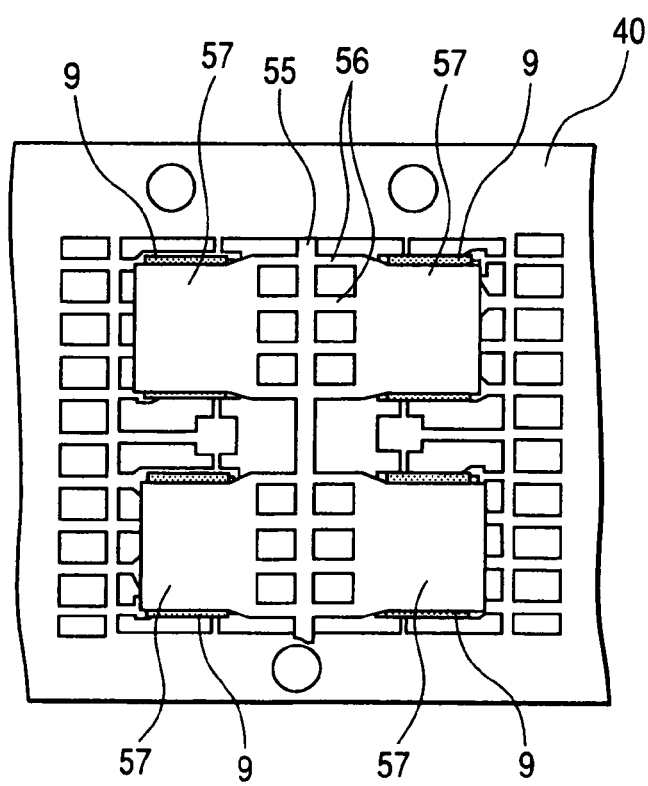
FIG. 21 is a schematic plan view showing a state in which drain electrode plates of the second lead frame are stacked and connected onto the semiconductor chips mounted on the first lead frame in manufacturing the semiconductor device of the first embodiment.

Next, as shown in FIG. 21, the support piece 55 is cut off from the second lead frame 50 and four electrode plates 57 serving as a heat sink are respectively superimposed on and connected to the semiconductor chips 9 on the first lead frame 40 through an adhesive (S103).

Figure 22:
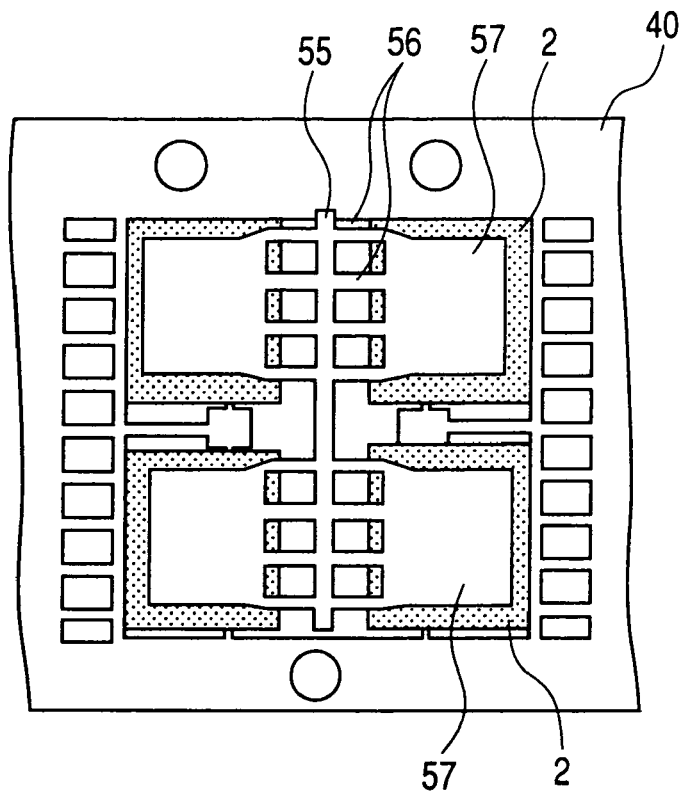
FIG. 22 is a schematic plan view showing a state in which sealing bodies are formed in manufacturing the semiconductor device of the first embodiment.

Then, as shown in FIG. 22, a sealing body 2 is formed using an insulating resin by means of a transfer molding apparatus (not shown) (S104). An upper surface of each electrode plate 57 is exposed to an upper surface of the associated sealing body 2. The semiconductor chip 9 and the electrode plate 47 connected to the salient gate and source electrodes 15, 16 on the semiconductor chip are buried into the sealing body 2. Lead portions 56 project from one side of the sealing body 2, while lead portions 46 project from an opposite side of the sealing body (see FIG. 23). By this resin sealing step, the resin which forms the sealing body 2 is filled into the depressions 3d and 3e and the projecting portions 3f bite into the resin (see FIGS. 7 and 8). As a result, the strength of bonding (adhesion) of the lead portions 56 and the electrode plate 57 to the sealing body 2 becomes higher.

Figure 23:
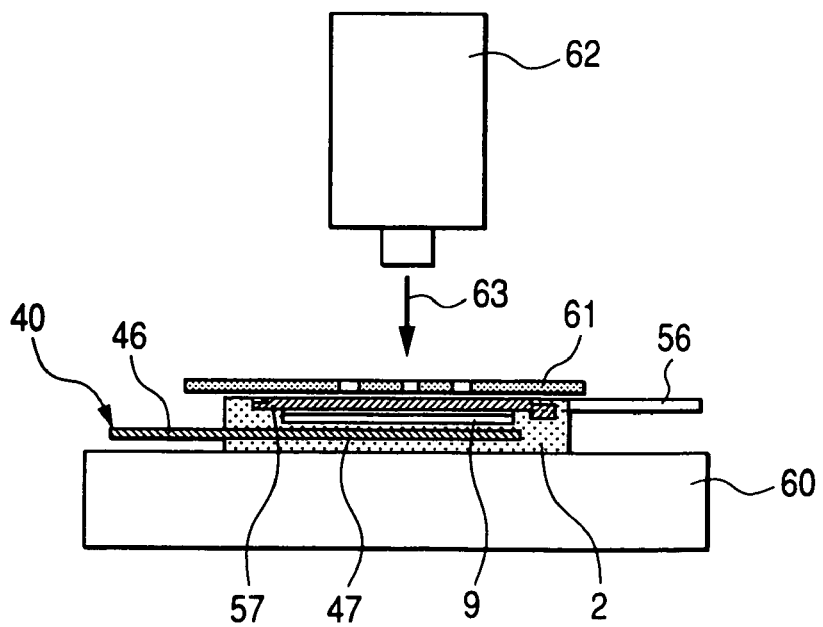
FIG. 23 is a schematic diagram showing a state in which marking is performed with a laser in manufacturing the semiconductor device of the first embodiment.

Next, as shown in FIG. 23, the first lead frame 40 having the sealing body 2 partially is placed on a stage 60 of a laser marking system, then a mask 61 is placed on the upper surface of the electrode plate 57, and a laser beam 63 is emitted from a laser oscillator 62 to form a mark (see FIG. 1) represented by concave and convex on the surface of the electrode plate (chip fixing portion 3c: drain electrode plate 3a) (S105).

Then, using a cutting and forming machine, though not shown, unnecessary lead frame portions are cut off from the portions corresponding originally to the first and second lead frames 40, 50 and the lead portions 56 and 46 projecting from the sealing body 2 are formed into a gull wing shape. In this way, plural such semiconductor devices 1 as shown in FIG. 2 are manufactured (S106).

According to the structure of the semiconductor device 1 of this first embodiment, since the drain electrode plate 3a (chip fixing portion 3c) serving as a heat sink is exposed to the upper surface of the sealing body 2, heat can be dissipated from the exposed surface. Therefore, the dissipation of heat can be attained by fixing a heat dissipating member to the upper surface of the drain electrode plate 3a through an adhesive.

Figure 24:
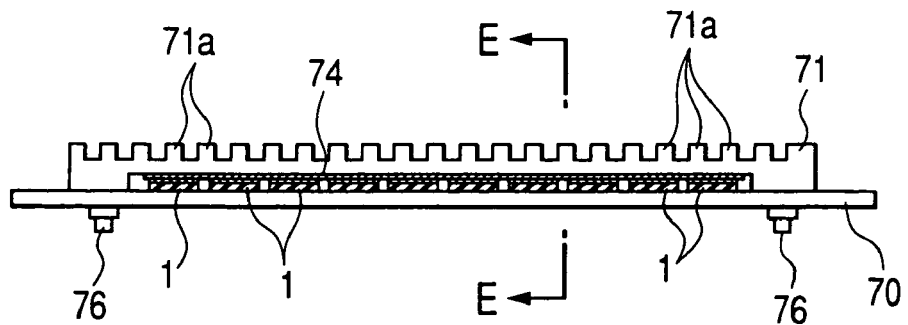
FIG. 24 is a partial, schematic front view showing a state in which plural semiconductor devices of the first embodiment are arranged orderly on a mounting substrate and a heat dissipating member is attached thereto.
Figure 25:
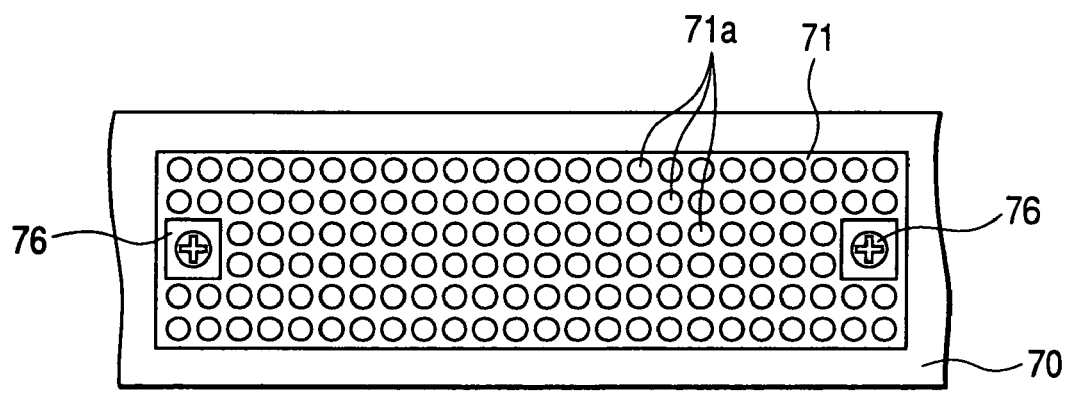
FIG. 25 is a partial, schematic plan view thereof.
Figure 26:
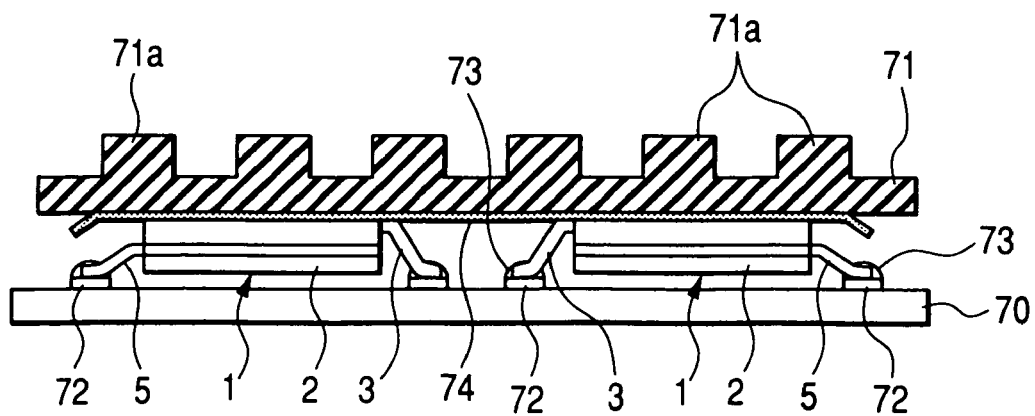
FIG. 26 is a sectional view taken along line E-E in FIG. 24.

FIGS. 24 to 29 show a state in which plural semiconductor devices 1 of the first embodiment are mounted orderly on a mounting substrate 70 and a heat dissipating member 71 common to all of the semiconductor devices 1 is mounted on the substrate. FIG. 24 is a schematic sectional view showing the mounted state, FIG. 25 is a schematic plan view, and FIG. 26 is an enlarged sectional view showing the mounted state.

Figure 30:
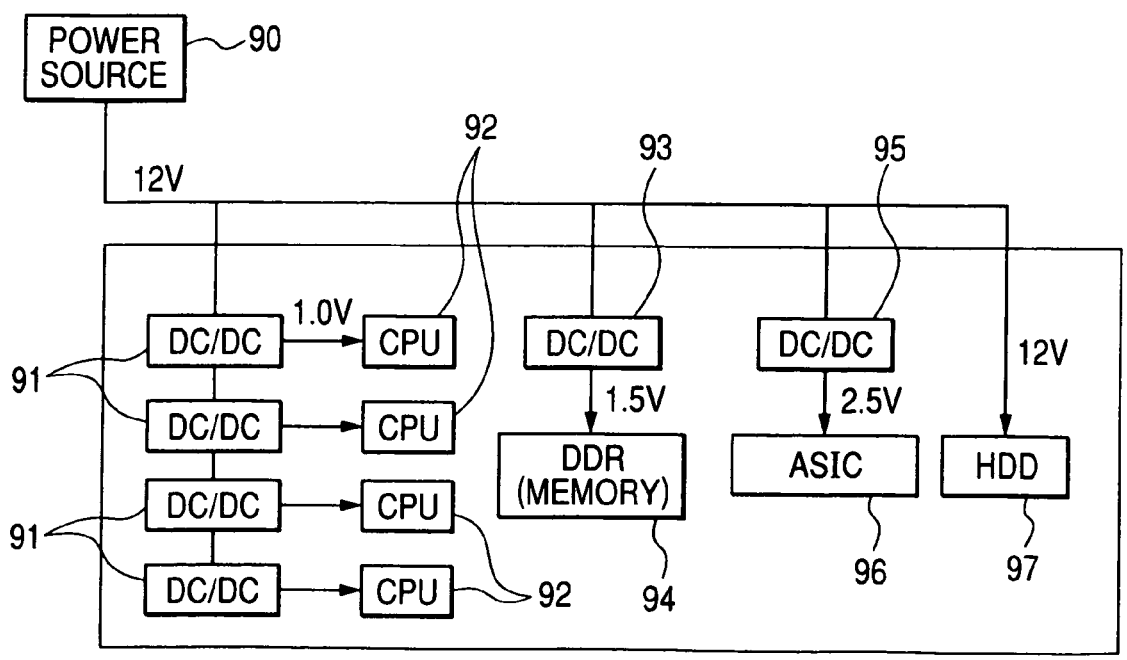
FIG. 30 is a block diagram showing the construction of a part of an electronic device in which the semiconductor device of the first embodiment is incorporated.

The package shown in FIG. 24 constitutes a part of the circuitry shown in FIG. 30. FIG. 30 is a step-down circuit diagram in an electronic device. The illustrated step-down circuitry comprises (1) a circuit which steps down a power supply 90 of 12V into a 1.0V power supply through DC/DC converters 91 and supplies the thus stepped-down voltage to CPUs (central control circuit) 92, (2) a circuit which steps down 12V to 1.5V and supplies the thus stepped-down voltage to a DDR (memory) 94, (3) a circuit which steps down 12V to 2.5V through a DC/DC converter 95 and supplies the thus stepped-down voltage to an ASIC 96, and a circuit which supplies 12V directly to an HDD 97.

The package shown in FIG. 24 constitutes the DC/DC converter 91. In manufacturing the DC/DC converter 91, as shown in FIG. 27, first a plurality of semiconductor devices 1 are mounted orderly on the mounting substrate 70.

Figure 27:
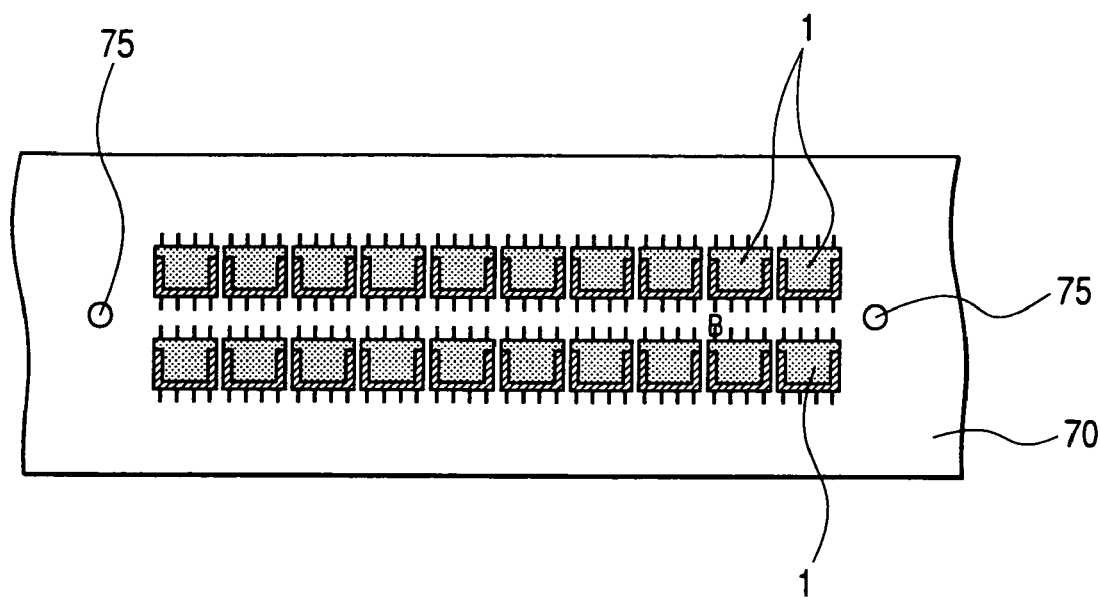
FIG. 27 is a partial, schematic plan view showing a state in which plural semiconductor devices of the first embodiment are arranged orderly on the mounting substrate.

As shown in FIG. 27, though not specially limited, a total of twenty (2 columns×10 rows) semiconductor devices 1 are mounted on an upper surface of the mounting substrate 70. Each semiconductor device 1 is mounted in such a state as shown in FIG. 26 in which front end portions of leads (drain leads 3 and source leads 5 in the figure) projecting in gull wing shape from both sides of the sealing body 2 in the semiconductor device 1 are electrically connected through a bonding material 73 such as solder to lands 72 formed on the upper surface of the mounting substrate 70. FIG. 29 is a further enlarged, schematic sectional view of the mounted state of the semiconductor device 1. As is seen also from this figure, the upper surface of the drain electrode plate 3a (chip fixing portion 3c) is exposed to the upper surface of the sealing body 2. Further, a mark 11 represented by concaves 11a and a convex 11b is formed on the upper surface of the exposed drain electrode plate 3a.

Figure 28:
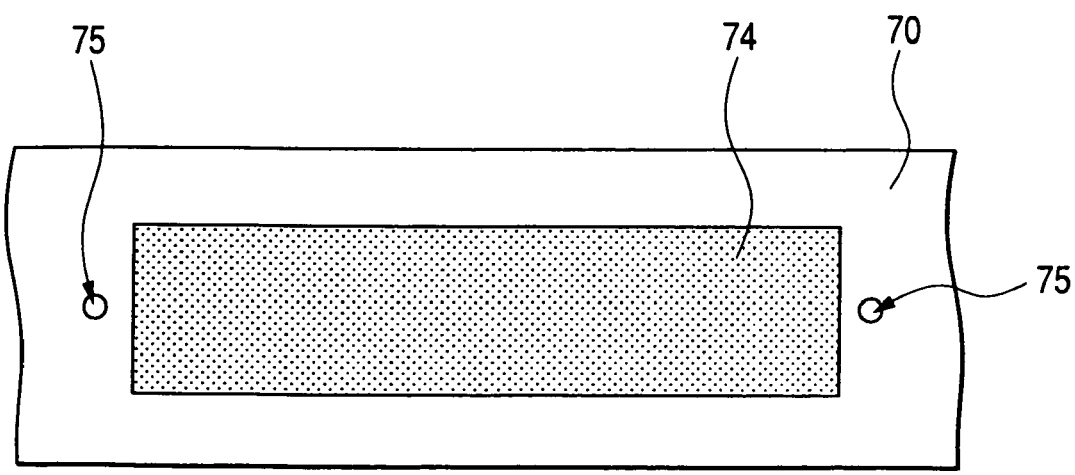
FIG. 28 is a partial, schematic plan view showing a state in which plural semiconductor devices of the first embodiment are mounted orderly on the mounting substrate and are covered with an insulating sheet.

Next, as shown in FIG. 28, an insulating sheet 74 is disposed on the semiconductor group so as to cover all of the semiconductor devices 1. Thereafter, the heat dissipating member 71 is superimposed on the insulating sheet 74. Tapped holes are formed in both end portions of the heat dissipating member 71, while in the mounting substrate 70 there are formed internally threaded holes 75 correspondingly to the tapped holes. Screws 76 are inserted into the tapped holes and then tightened to afford such a package as shown in FIGS. 24 and 25.

In this package, heat generated in each semiconductor device 1 is transferred from the drain electrode plate in each semiconductor device 1 to the heat dissipating member 71 through the insulating sheet 74 and is dissipated into the atmosphere from surfaces of cylindrically projecting heat dissipating cores 71a formed on the upper surface of the heat dissipating member 71.

In this package, when the screws 76 are tightened, as shown in FIG. 29, the insulating sheet 74 formed of resin is crushed, then gets into the concaves 11a as a constituent of the mark 11 and comes into close contact with the concaves. Since the mark 11 has the concaves 11a and convex 11b, the heat dissipating area of the drain electrode plate 3a becomes wide. As a result, the heat generated in each semiconductor device 1 is transferred more effectively to the heat dissipating member 71, so that it is possible to improve the heat dissipating effect of the package. For example, if the mark is formed with ink on the surface of a metallic plate, the ink may cause deterioration of the heat dissipating effect (heat transfer effect) because it is made of resin.

The following effects are obtained by this first embodiment.

(1) The semiconductor device (power MOSFET device) 1 has the drain electrode plate 3a whose upper surface is exposed to the upper surface of the sealing member 2. The semiconductor chip 9 is connected to the drain electrode plate 3a through the back electrode (drain electrode) 10 of the chip. The back electrode 10 is of about the same size as the semiconductor chip 9. As a result, the heat generated in the semiconductor chip 9 can be transferred effectively to the drain electrode plate 3a. Therefore, by attaching the heat dissipating member 71 to the drain electrode plate 3a, the heat can be dissipated to the exterior effectively and it is possible to provide the semiconductor device 1 and semiconductor package (i.e., electronic device) superior in heat dissipating performance. According to the semiconductor device 1 of this first embodiment, even without the heat dissipating member, it is also possible to dissipate heat into the atmosphere from the surface of the wide drain electrode plate 3a.

The semiconductor device 1 is of the structure wherein heat is dissipated from the upper surface side of the sealing body 2, so unlike the prior art, no consideration is needed to the dissipation of heat to the mounting substrate, nor is it necessary to use an expensive mounting substrate of a special specification for improving the heat transfer characteristic. As a result, it is possible to reduce the packaging cost.

(2) In manufacturing the semiconductor device 1 with use of a lead frame, the drain electrode plate portion projecting to the exterior from the sealing body 2 is formed into a gull wing shape suitable for surface mounting. This formed portion is slit into plural branch pieces (lead portions) 56 and therefore the forming work is easier than forming a single plate, that is, a large forming load is not needed. Consequently, the forming work can be done with a high accuracy without causing damage to the connections (adhesive 7 and salient gate and source electrodes 15, 16) between the semiconductor chip 9 and leads. More particularly, as the drain electrode plate 3a there is used a thicker plate than the source and gate electrode plates 5a, 4a in order to decrease the electric resistance, so if the drain electrode plate 3a is formed in a gull wing shape, a larger load is used for bending. As a result, the drain electrode plate 3a connected to the sealing body 2 undergoes a large stress in a direction in which it is pulled out from the sealing body 2, with consequent damage to the connections with the semiconductor chip. Damage of the connections is not desirable because it would cause an increase of source-drain resistance Rds (ON). In the present invention, plural slits are formed in the drain electrode plate 3a to be subjected to forming in a gull wing shape, thereby forming plural branch pieces (leads) 56, so that a large load is not needed in the forming work. As a result, a large stress is not imposed on the drain electrode plate 3a in the forming work and hence it is possible to prevent damage of the connections on the surface and back of the semiconductor chip 9. This is also the case with the source electrode plate 5a. By forming plural slits in the source electrode plate 5a to provide plural branch pieces (lead portions) 46, it is possible to carry out the forming work without causing damage to the connections with the semiconductor chip 9.

(3) By forming depressions 3d and 3e partially on the surface of the drain electrode plate 3a positioned within the sealing body 2 and by injecting the resin which forms the sealing body into the depressions, the drain electrode plate in the state of product becomes difficult to fall off from the sealing body 2. In the manufacturing stage for the semiconductor device 1, the upper surface of the drain electrode plate 3a positioned within the sealing body 2 is partially lowered to form depressions 3d and 3e and the back surface portions corresponding to the depressions 3e are projected to form projecting portions 3f. Consequently, in the stage where the sealing body 2 was formed, the resin which forms the sealing body 2 gets into the depressions 3d and 3e, while the projecting portions 3f bite into the resin. As a result, the drain electrode plate 3a is fixed (locked) to the sealing body (resin). Therefore, in the forming work for the drain electrode plate 3a, the drain electrode plate 3a does not move relative to the sealing body 2 and it is possible to carry out the forming work without causing damage to the connections with the semiconductor chip 9.

In the forming work for the drain electrode plate 3a, a tensile stress is imposed on the drain electrode plate 3a in the extending direction of the surface mounting terminals (drain leads 3: branch pieces) and the drain electrode plate 3a extending within the sealing body 2 undergoes a stress in the pull-out direction. At this time, the resin-engaged portions of the depressions 3d, 3e and the projecting portions 3f extending in a direction orthogonal to the pull-out direction act to diminish the stress acting in the pull-out direction. Therefore, it is also effective to form the projecting portion 3f on the lower surface of the drain electrode plate 3a so as not to obstruct the flow of resin which is for forming the sealing body 2. For example, it is also effective to adopt a method wherein one front end side of the drain electrode plate 3a extending within the sealing body 2 is subjected to extrusion from the upper surface in the state of lead frame to form a depression 3d in the upper surface of the front end of the drain electrode plate 3a and a projecting portion is formed on the lower surface, i.e., back side, of the drain electrode plate 3a at a position corresponding to the depression 3d. Further, there may be adopted a method wherein concaves and convexes are formed in side edges of the drain electrode plate 3a extending within the sealing body 2 and damage of the connections with the semiconductor chip in the forming work for the drain electrode plate 3a is prevented by engagement of the concaves and convexes with the resin.

(4) In the semiconductor device 1 of this first embodiment, the mark 11 is formed on the surface of the drain electrode plate 3a which is a metallic plate exposed to the upper surface of the sealing body 2, by means of a laser marking system. More specifically, concaves 11a are formed in the surface of the metallic plate by the radiation of a laser beam and are combined with a convex 11b to form the mark 11. Thus, the mark 11 free of any likelihood of dislodgment can be formed in a simple manner and hence it is possible to reduce the cost for forming the mark.

(5) According to the structure of the semiconductor device 1 of this first embodiment, the drain electrode plate 3a exposed to the upper surface of the sealing body 2 is used as a heat transfer medium and the heat generated in the semiconductor chip 9 is dissipated directly into the atmosphere or is transferred to the heat dissipating body 71 which is superimposed on the semiconductor device 1. In the semiconductor device 1 of this first embodiment, concaves 11a are formed on the exposed surface of the drain electrode plate 3a as a heat transfer medium by the radiation of a laser beam and are combined with a convex 11b to form the mark 11. Therefore, the surface area of the drain electrode plate 3a serving as a heat dissipating surface increases and the heat generated in the semiconductor chip 9 can be dissipated into the atmosphere directly and more efficiently or can be transferred to the heat dissipating member 71. Consequently, it is possible to provide a semiconductor package, i.e., electronic device, superior in heat dissipating performance.

Although the present invention has been described above concretely by way of an embodiment thereof, it goes without saying that the present invention is not limited to the above embodiment, but that various modifications may be made within the scope not departing from the gist of the invention. Although in the above embodiment a power MOSFET is incorporated in the semiconductor chip, the element to be incorporated in the chip may be such a transistor as MOSFET, power bipolar transistor, or IGBT, or an IC including a transistor.

What is claimed is:

1. A semiconductor device comprising:
    a semiconductor chip including a MOSFET and having a top surface and a bottom surface opposite to the top surface, said semiconductor chip having a source electrode and a gate electrode of the MOSFET on the top surface and a drain electrode of the MOSFET on the bottom surface:
    a source electrode plate having source leads disposed over the source electrode and electrically connected to the source electrode, said source electrode plate being positioned above the semiconductor chip, and said source leads being extended outward from the source electrode plate;
    a gate electrode lead having a gate lead disposed over the gate electrode and electrically connected to the gate electrode, said gate electrode lead being positioned above the semiconductor chip, and said gate lead being extended outward from the gate electrode lead;
    a drain electrode plate having drain leads disposed over the drain electrode and electrically connected to the drain electrode, said drain electrode plate being positioned above the semiconductor chip, and said drain leads being extended outward from the drain electrode plate; and
    an insulating resin covering the semiconductor chip, the source electrode plate and the gate electrode lead;
    wherein the drain electrode plate is exposed from the insulating resin;
    the drain leads, the source leads and the gate lead are bent to form surface mounting terminals;
    bent portions of the drain, source and gate leads are positioned outside the insulating resin; and
    the surface mounting terminals of the drain leads and the surface mounting terminals of the source and gate leads are positioned opposite sides of the insulating resin.

2. A semiconductor device according to claim 1, wherein source bump electrodes are disposed on the source electrode;
    a gate bump electrode is disposed on the gate electrode;
    the source electrode plate is connected via the source bumps; and
    the gate electrode lead is connected via the gate bump electrode.

3. A semiconductor device according to claim 2, wherein the source and gate bump electrodes are comprised of Au.

4. A semiconductor device according to claim 1, wherein the drain electrode plate and the drain electrode are connected via Ag paste.

5. A semiconductor device according to claim 1, wherein source bump electrodes are disposed on the source electrode;
    a gate bump electrode is disposed on the gate electrode;
    the source electrode plate is connected via the source bumps;
    the gate electrode lead is connected via the gate bump electrode; and
    the drain electrode plate and the drain electrode are connected via Ag paste.

6. A semiconductor device according to claim 1, wherein the surface mounting terminals of the source, gate and drain leads are in a same plane.

7. A semiconductor device according to claim 1, wherein the insulating resin has a top surface and a bottom surface opposite to the top surface;
    the top surface faces toward the drain electrode;
    the bottom surface faces toward the source and gate electrodes; and
    the surface mounting terminals of the source, gate and drain leads and the bottom surface of the insulating resin are in a same plane.

8. A semiconductor device according to claim 1, wherein a heat sink is disposed on the drain electrode plate and connected to the drain electrode plate.

* * * * *